United States Patent [19]

Malfaz

[11] Patent Number: 5,243,753
[45] Date of Patent: Sep. 14, 1993

[54] PRINTED CIRCUIT ASSEMBLY MACHINE

[76] Inventor: Andres Malfaz, Palencia, 2-2°.-01002 Vitoria - Alava, Spain

[21] Appl. No.: 919,903

[22] Filed: Jul. 27, 1992

[51] Int. Cl.$^5$ ............................................. B23P 19/00
[52] U.S. Cl. ....................................... 29/743; 29/740; 29/DIG. 44; 29/714
[58] Field of Search ......... 29/739, 740, 743, DIG. 44, 29/829, 830, 831, 832, 834, 842, 703, 709, 714, 721

[56] References Cited

U.S. PATENT DOCUMENTS

| | | | |
|---|---|---|---|
| 4,204,319 | 5/1980 | Bishop | 29/743 X |
| 4,283,845 | 8/1981 | Sigel et al. | 29/743 X |
| 4,778,326 | 10/1988 | Althouse et al. | 29/743 X |
| 4,914,809 | 4/1990 | Fukai et al. | 29/743 X |
| 5,048,178 | 9/1991 | Bindra et al. | 29/834 X |
| 5,056,296 | 10/1991 | Ross et al. | 29/743 X |

FOREIGN PATENT DOCUMENTS

| | | | |
|---|---|---|---|
| 0430992 | 7/1991 | European Pat. Off. | 29/743 |
| 2451549 | 8/1976 | Fed. Rep. of Germany | 29/743 |
| 0420016 | 7/1974 | U.S.S.R. | 29/743 |
| 0421073 | 8/1974 | U.S.S.R. | 29/743 |

*Primary Examiner*—Timothy V. Eley
*Assistant Examiner*—C. Richard Martin
*Attorney, Agent, or Firm*—Lucas & Just

[57] ABSTRACT

Printed circuit assembly machine, consisting of a flat lower base, capable of moving up and down, and of a curved upper base capable of tilting, both being drilled with a multitude of holes, through which a vacuum is created, characterized in that both lower and upper bases have their holes distributed in independent zones, each zone being provided with a vacuum tube, which regulates the vacuum in each of them, and a microprocessor with program for controlling operation of the vacuum tubes.

11 Claims, 2 Drawing Sheets

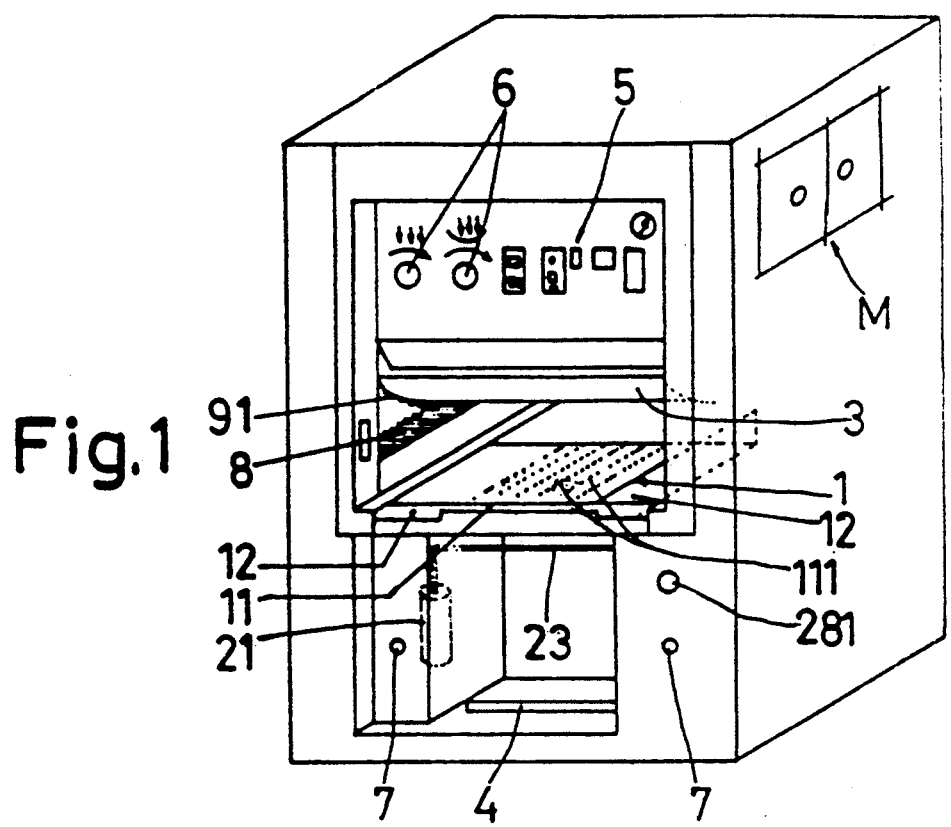
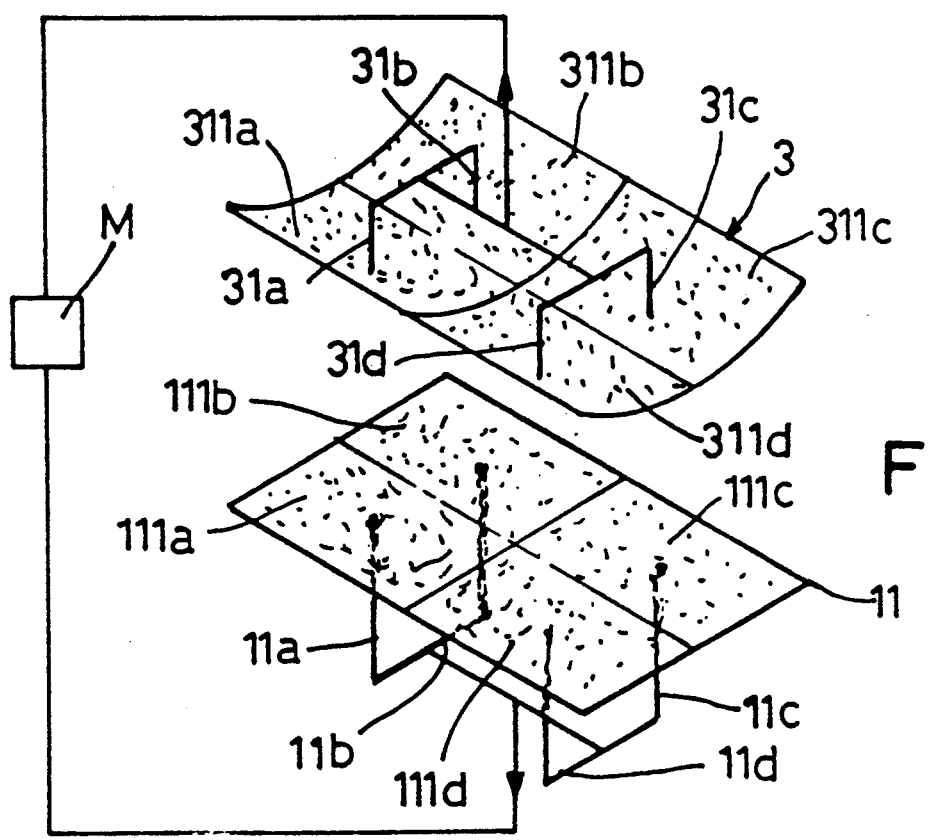

PRINTED CIRCUIT ASSEMBLY MACHINE

This invention involves a printed circuit assembly machine.

The present printed circuits are of very different size and ultimate characteristics, meaning that the laminar components that are to be coupled to form the circuit are also of different size from each other. On the other hand, the printed circuit sometimes consists of two elements and other times of up to five superposed elements.

The present machines are very difficult to adapt to the handling and assembly of circuits of such different sizes and thicknesses.

It is a question of including in the present printed circuit assembly machines, which consist of a flat lower base capable of moving up and down and of a curved upper base capable of tilting, both drilled with a multitude of holes through which a vacuum is created, means for making different independent zones on said bases operational, by regulating the vacuum in each of said zones to use only the zone or zones necessary in each case.

It is also a question of including means of controlled regulation and separation of the distance between bases, in the working phase, in order to manage with the same machine to assemble printed circuits with different number of laminar components and, consequently, of different thickness.

FIG. 1 represents a schematic general view in perspective of a circuit assembly machine, according to the invention, a preferred general arrangement of its integral basic elements being shown.

FIG. 4 represents by diagram a working arrangement of means for regulating and controlling the capacity as well as the surface of absorption of the moving bases (1), (3).

In accordance with the invention, the circuit assembly machine basically includes, in a general frame, the following components:

1. Flat lower base.
2. Drive gear working the lower base.
3. Curved upper base.
4. Pedal.
5. Diaphragm keyboard.
6. (Circuit) regulating controls.
7. (Absorption) regulating controls.
8. Rack.
M. Microprocessor.
9. Drive gear working the upper base.

The circuit assembly machine can work at both low and high temperatures.

It consists of a moving flat base (1) with a drive gear (2) capable of moving it up and down.

The lower base (1) contains a work table (11) and a frame (12) or case of same.

The work table (11) has multiple holes (111) on all or part of its surface for purpose of circuit bearing plate absorption.

Figure 2:
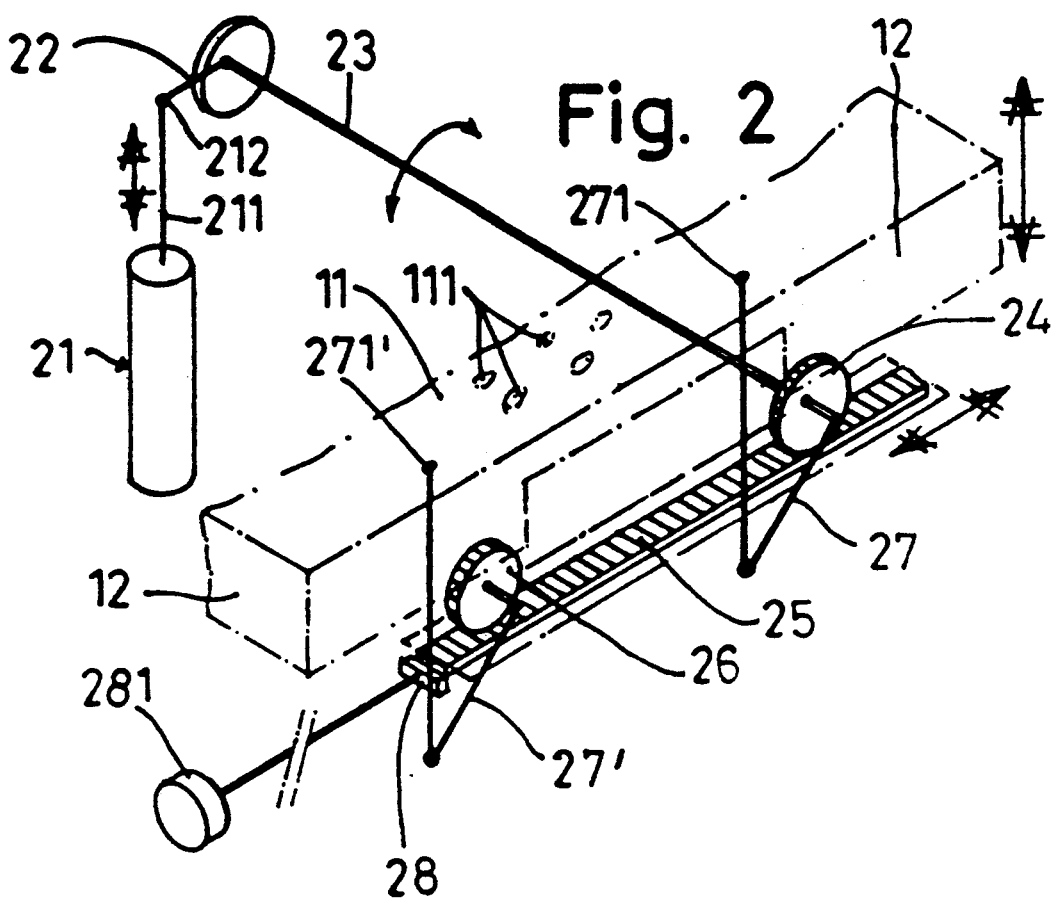
FIG. 2 represents by diagram a preferred practical embodiment of the drive gear (2) used to move the lower base (1) up and down.

In a nonlimitative practical embodiment represented on FIG. 2, the drive gear (2) consists of 21. Drive roller.
22. Connecting rod.
23. Shaft.
24. Lower pulley.
25. Rack.
26. Lower pulley.
27—27'. Connecting rods.
28. Limit stop.

The fluid drive roller (21), whose piston rod (211) is jointed at (212) to the connecting rod (22), cyclically displaces the shaft (23).

The shaft (23) bears at least one toothed lower pulley (24), whose toothing meshes with that of a rack (25) guided on the frame of the machine and which, consequently, is linearly and cyclically displaced.

The linear and cyclic displacement of the rack (25) produces synchronized angular and cyclic displacement of a second lower pulley (26).

Both pulleys (24), (26) each carry on their respective shafts (23), (261) connecting rods (27), (27') jointed at (271), (271') to the frame (12) bearing the work table (11) which, consequently, ascends or descends according to the direction of rotation of the pulleys (24), (26).

The range of said ascent/descent is defined by a stop (28), which limits at will the displacement of the rack (25), on being positioned from an outside control (281).

The flat lower base (1) is moved from top to bottom by means of the gear (2) described, its height being adjustable according to the thickness of material to be assembled.

The upper base (3) has a convex curvature of very wide radius and also has multiple holes for absorption of the plate.

The curved upper base (3) is displaced on at least one toothed rack (8) mounted on the machine's general frame.

The movement of said upper base (3) is produced by an operating drive gear (9).

Figure 3:
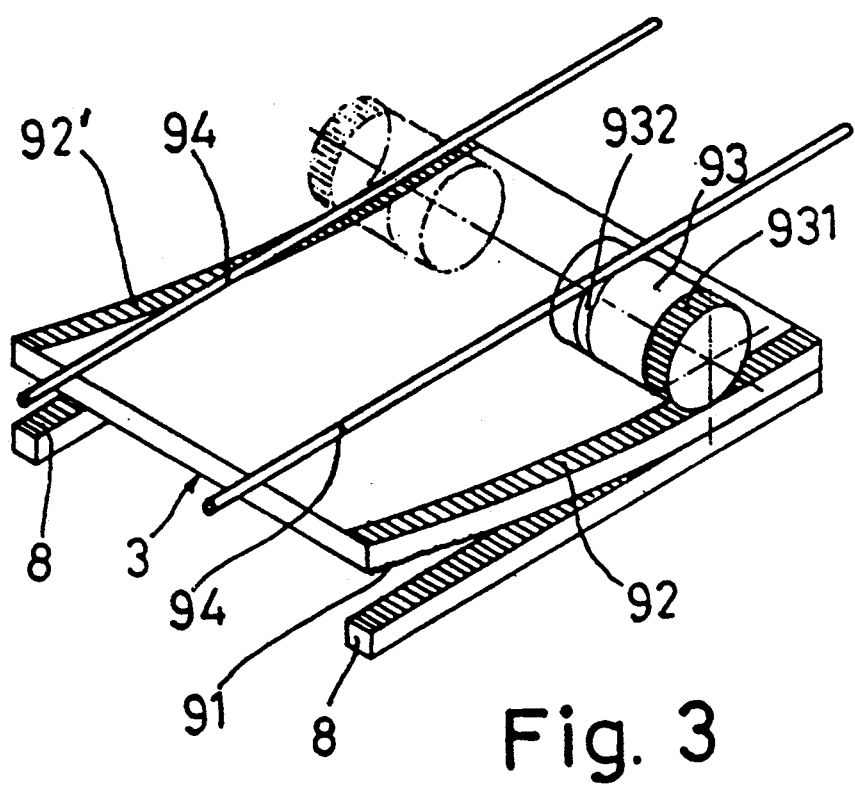
FIG. 3 represents by diagram a preferred practical embodiment of the drive gear (9) used to move the upper base (3).

In a nonlimitative practical embodiment represented on FIG. 3, the drive gear (9) consists of:

91, 92—92'. Racks.
93. Pulleys.
94. Runways.

The rack (91)—or each rack (91)—is combined with the rack(s) (8) with which it(they) engage(s).

The racks (92), (92') are combined with other racks (931) provided on the pulleys (93).

The runways (94), arranged on the frame of the machine, are combined with other runways (932) provided on the pulleys (93).

The pulleys (93) are rotated by any external means, arranged on the general frame of the machine.

The table (11) of the moving base (1) and the curved platform of the moving base (3) each have multiple holes (111), (311) on all or part of their surface, said holes (111), (311) being joined by zones (111a), (311a), (111b), (311b), (111c), (311c), (111d), (311d) to different pneumatic means (11a), (31a), (11b), (31b), (11c), (31c), (11d), (31d) of a circuit that can be regulated with controls (6) for operating them independent of each other, have their absorption capacity regulated with controls (7) and be synchronized by a microprocessor (M) from a central unit.

Controls (7) regulated absorption in accordance with the surface needed, for depending on the surface of the circuit bearing plate, absorption is necessary on all or part of the moving base(s) (1), (3).

The machine is totally pneumatic with electronic regulation by processor (M).

With this arrangement, operation is as follows:

Phase 1:
—the circuit bearing plate is placed on the—mobile—lower flat base (1);
—the pedal (4) is worked and absorption takes place on the mobile flat base (3) which has multiple holes (311) on its entire surface;
—the plate does not move from its flat bearing base (1).

Phase 2:
The mobile base (1) is raised by the gear (2) and at that time the likewise mobile upper base (3) is lowered by action of the drive gear (9). The single processor (M) reverses the flow of air of the pneumatic circuit and absorption now takes place on the mobile upper base (3), leaving the bearing plate stationary on this mobile base (3).

Phase 3:
The plate to be joined is placed on the—flat—mobile lower base (1).

Phase 4:
The lower flat base (1) raise and the upper curved base (3) drops, thereby achieving the joining of the two circuit bearing plates.

Phase 5:
Return to its initial position.

I claim:

1. Printed circuit assembly machine having a frame, comprising a flat lower base, capable of moving up and down, and a curved upper base capable of tilting, both being drilled with a multitude of holes, through which a vacuum is created, and wherein both lower and upper bases have their holes distributed in a plurality of independent zones, each zone being provided with a vacuum tube, which regulates the vacuum in each of them, and a microprocessor with program for controlling operation of the vacuum tubes.

2. Printed circuit assembly machine, according to claim 1, further including a lower base drive gear which consists of a fluid drive roller, whose piston, joined to a connecting rod, cyclically rotates a shaft bearing at least one toothed lower pulley, which moves guided on a rack, through which it cyclically rotates a second toothed lower pulley, both lower pulleys each having connected rods mounted on their shafts, joined to a frame bearing a work table, said frame and work table being contained in said lower base.

3. Printed circuit assembly machine, according to claim 1, further including an upper base drive gear which consists of corresponding racks on the upper base and corresponding runways on the frame of the machine, on which are mounted corresponding pulleys which, driven in rotation, cyclically displace the upper base and, for the purpose, each pulley contains a combined runway and toothing.

4. Printed circuit assembly machine, according to claim 1, characterized in that it includes pneumatic means, electronically regulated by a processor and pedal-operated for controlling and synchronizing the movement of said upper and lower bases.

5. Printed circuit assembly machine, according to claim 1, characterized in that it includes means capable of regulating the absorption capacity depending on the surface of at least one of the upper and lower bases.

6. Printed circuit assembly machine, according to claim 1, characterized in that it includes means for regulating the distance between said upper and lower bases.

7. Printed circuit assembly machine comprising a flat lower base, capable of moving up and down, and a curved upper base capable of tilting, both being drilled with a multitude of holes, through which a vacuum is created, characterized in that both lower and upper bases have their holes distributed in independent zones, each zone being provided with a vacuum tube, which regulates the vacuum in each of them, and a microprocessor with program for controlling operation of the vacuum tubes and further characterized in that a lower base drive gear consists of a fluid drive roller, whose piston, joined to a connecting rod, cyclically rotates a shaft bearing at least one toothed lower pulley, which moves guided on a rack, through which it cyclically rotates a second toothed lower pulley, both lower pulleys each having connected rods mounted on their shafts, joined to a frame bearing a work table, said frame and work table being contained in said lower base.

8. Printed circuit assembly machine comprising a flat lower base, capable of moving up and down, and a curved upper base capable of tilting, both being drilled with a multitude of holes, through which a vacuum is created, characterized in that both lower and upper bases have their holes distributed in independent zones, each zone being provided with a vacuum tube, which regulates the vacuum in each of them, and a microprocessor with program for controlling operation of the vacuum tubes and further characterized in that an upper base drive gear consists of corresponding racks on the upper base and corresponding runways on the frame of the machine, on which are mounted corresponding pulleys which, driven in rotation, cyclically displace the upper base and, for the purpose, each pulley contains a combined runway and toothing.

9. Printed circuit assembly machine comprising a flat lower base, capable of moving up and down, and a curved upper base capable of tilting, both being drilled with a multitude of holes, through which a vacuum is created, characterized in that both lower and upper bases have their holes distributed in independent zones, each zone being provided with a vacuum tube, which regulates the vacuum in each of them, and a microprocessor with program for controlling operation of the vacuum tubes and further characterized in that it includes pneumatic means, electronically regulated by a processor and pedal-operated for controlling and synchronizing the movement of said upper and lower bases.

10. Printed circuit assembly machine comprising a flat lower base, capable of moving up and down, and a curved upper base capable of tilting, both being drilled with a multitude of holes, through which a vacuum is created, characterized in that both lower and upper bases have their holes distributed in independent zones, each zone being provided with a vacuum tube, which regulates the vacuum in each of them, and a microprocessor with program for controlling operation of the vacuum tubes and further characterized in that it includes mans capable of regulating the absorption capacity depending on the surface of at least one of the upper and lower bases.

11. Printed circuit assembly machine comprising a flat lower base, capable of moving up and down, and a curved upper base capable of tilting, both being drilled with a multitude of holes, through which a vacuum is created, characterized in that both lower and upper bases have their holes distributed in independent zones, each zone being provided with a vacuum tube, which regulates the vacuum in each of them, and a microprocessor with program for controlling operation of the vacuum tubes and further characterized in that it includes means for regulating the distance between said upper and lower bases.

* * * * *

UNITED STATES PATENT AND TRADEMARK OFFICE
CERTIFICATE OF CORRECTION

PATENT NO. : 5,243,753
DATED : September 14, 1993
INVENTOR(S) : Andres Malfaz

It is certified that error appears in the above-identified patent and that said Letters Patent is hereby corrected as shown below:

Column 4, line 54 (claim 10), change "mans" to --means--.

Signed and Sealed this

Fifteenth Day of March, 1994

Attest:

BRUCE LEHMAN

*Attesting Officer*　　*Commissioner of Patents and Trademarks*